United States Patent [19]

Weiss et al.

[11] Patent Number: 5,390,317
[45] Date of Patent: Feb. 14, 1995

[54] TECHNIQUE TO SUPPORT PROGRESSIVELY PROGRAMMABLE NONVOLATILE MEMORY

[75] Inventors: Donald G. Weiss; Laura M. Dobbs; James S. Thomas; Gregory A. Racino, all of Austin, Tex.

[73] Assignee: Motorola, Inc., Schaumburg, Ill.

[21] Appl. No.: 210,409

[22] Filed: Mar. 18, 1994

Related U.S. Application Data

[63] Continuation of Ser. No. 739,370, Aug. 2, 1991, abandoned.

[51] Int. Cl.⁶ .................. G06F 12/00; G06F 12/16
[52] U.S. Cl. ................. 395/425; 365/230.03; 364/DIG. 1; 364/238.4; 364/244.7; 364/246.3; 364/251; 364/926.92; 364/965.76; 364/965.79; 364/965.4
[58] Field of Search ............... 395/425; 364/200 MS File, 900 MS File; 365/185, 230.03

[56] References Cited

U.S. PATENT DOCUMENTS

| | | | |
|---|---|---|---|
| 3,934,227 | 1/1976 | Worst | 340/172.5 |
| 4,701,886 | 10/1987 | Sakakibara et al. | 371/21.1 |
| 4,752,871 | 6/1988 | Sparks et al. | 395/800 |
| 4,802,119 | 1/1989 | Heene et al. | 395/400 |
| 4,811,287 | 3/1989 | Kupersmith et al. | 365/52 |
| 4,903,265 | 2/1990 | Shannon et al. | 371/21.4 |
| 4,975,878 | 12/1990 | Boddu et al. | 365/189.07 |
| 5,007,026 | 4/1991 | Gualtieri et al. | 365/201 |
| 5,046,029 | 9/1991 | Ikeda | 364/561 |
| 5,046,180 | 9/1991 | Ueda et al. | 365/189.03 |
| 5,093,785 | 3/1992 | Iijima | 395/400 |
| 5,097,445 | 3/1992 | Yamauchi | 365/195 |
| 5,109,359 | 4/1992 | Sakakibara et al. | 365/189.07 |
| 5,134,583 | 7/1992 | Matsuo et al. | 365/200 |
| 5,175,840 | 12/1992 | Sawase et al. | 395/425 |
| 5,199,032 | 3/1993 | Sparks et al. | 371/3 |
| 5,202,994 | 4/1993 | Begur et al. | 395/700 |

FOREIGN PATENT DOCUMENTS 87401164  5/1987  European Pat. Off.

*Primary Examiner*—Joseph L. Dixon
*Assistant Examiner*—Frank J. Asta
*Attorney, Agent, or Firm*—Susan C. Hill

[57] ABSTRACT

A nonvolatile memory (28) in a data processor (10) is capable of being progressively programmed and/or accessed in a user determined number of sections. A user can program and/or access what appears to the user to be reprogrammable nonvolatile memory (28) at a same address when in actuality the user is programming and accessing sequential sections of nonvolatile memory (28). Nonvolatile information stored in nonvolatile control bits (20) is used to control which section of the nonvolatile memory is connected to a communication bus and is thus accessible to the user. When the user desires to write and/or access a new section of nonvolatile memory (28), either the user directly asserts one of the nonvolatile control bits (20) using software, or the nonvolatile control (24) asserts one of the nonvolatile control bits (20) using hardware.

21 Claims, 3 Drawing Sheets

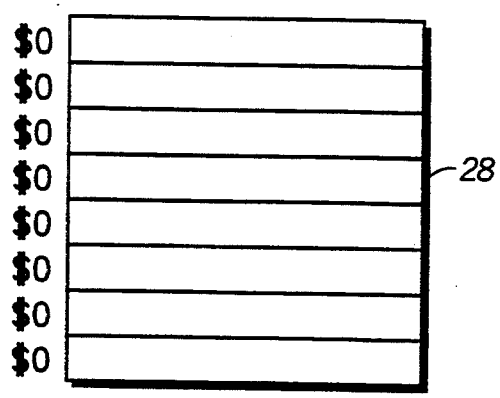
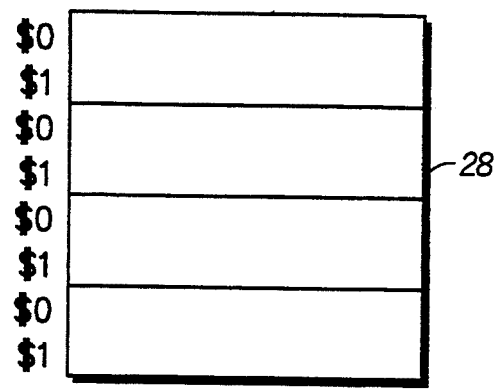
OPTION A
FIG.2A
OPTION B
FIG.2B
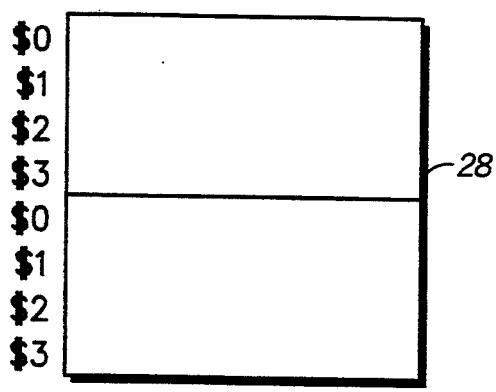
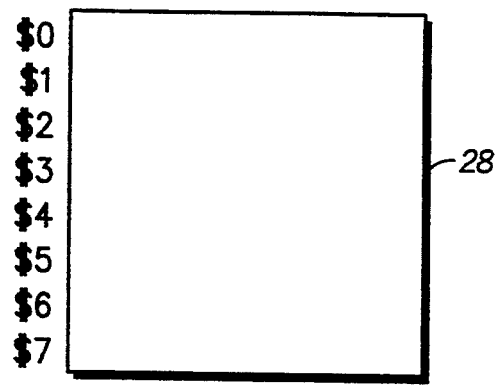
OPTION C
FIG.2C
OPTION D
FIG.2D

TECHNIQUE TO SUPPORT PROGRESSIVELY PROGRAMMABLE NONVOLATILE MEMORY

This application is a continuation of prior application Ser. No. 07/739,370, filed Aug. 2, 1991, now abandoned.

Field of the Invention

The present invention relates in general to nonvolatile memories, and more particularly, to programming one or more sections of a nonvolatile memory.

Background of the Invention

Most product manufacturers using microcontroller units or microcontrollers (MCUs) in their products have the following general goals: (1) to use the smallest total number of chips as possible in their application, which is often accomplished by incorporating as many functions as possible onto the MCU; and (2) to keep the total cost of the chips to a minimum. In addition, some applications require nonvolatile memory that can be reprogrammed a limited number of times. An example of such an application is an automobile engine controller that uses nonvolatile memory to store calibration constants fiat might need to be changed several times over the lifetime of the automobile. A memory that can be effectively reprogrammed several times is required in order to allow the calibration constants to be changed as the behavior of the engine changes over the lifetime of the car. Nonvolatile memory is required in order to prevent loss of the stored information when power to the system is lost, for example when the car battery dies.

The presently available solutions are relatively costly. Because of its high testing costs, Electrically Erasable Programmable Read Only Memory (EEPROM or E$^2$PROM) is usually too expensive a solution. Also, because EEPROMs are designed for several thousand write-erase cycles, such memories are costly overkill for applications that only require a much more limited number of write-erase cycles. Erasable Programmable Read Only Memory (EPROM) generally has lower testing costs, but it requires an expensive ceramic package with a clear lid to enable the EPROM to be erased using ultraviolet light.

In order to reduce costs, some semiconductor manufacturers have turned to packaging EPROMs in much cheaper plastic packages which effectively prevents the EPROM from ever being erased. The name given to this type of memory is One Time Programmable (OTP) memory. The advantage to OTP memory is that it can be programmed by the user at his convenience, unlike Read Only Memory (ROM) which must be programmed during the chip manufacturing process. However, the drawback to OTP memory is that each memory cell can only be programmed to its asserted state (i.e. non-virgin state) once by the user because there is no way to erase a memory cell: What some product manufacturers want and need is a cheap type of memory located on the MCU that can be reprogrammed a limited number of times.

Normally a software pointer is used to keep track of the location of information in a memory. But in many MCU applications, an updatable software pointer cannot readily be used for this purpose. This is because if the pointer value was held in volatile memory and the power supply failed, the pointer value would be lost and the software would not be able to locate the current information. And if nonvolatile memory was used to hold the pointer value, there is again the problem that expensive E$^2$PROM would be required in order to allow the software to continuously update the pointer.

"Smart" credit card applications have found a very simplistic solution to this problem. A "smart" credit card is a plastic credit card that contains an embedded MCU that uses OTP memory to keep a running balance of the money remaining in the card holder's account. The software controlling the MCU starts at the beginning of OTP memory and writes the beginning account balance into the first OTP memory location. The rest of the OTP memory has not been written yet and is still in its virgin state, for example all zeros. When a credit card transaction is initiated, the software must determine which address location in OTP memory contains the current account balance. The software does this by reading the OTP memory and determining where the virgin state of the OTP memory begins, for example where the pattern of all zeros begins. Of course as a result, the data value of all zeros cannot be used to indicate an account balance. Once the beginning of the virgin portion of the OTP memory is located, the immediately preceding value is assumed to be the current account balance. The new account balance is then written into the next consecutive OTP memory location.

Unfortunately, the solution used by smart cards has some inherent limitations and drawbacks. First, the software cannot be written using a known, fixed address location for the data in the OTP memory because the address location which contains the current data (i.e. the current account balance for smart cards) changes each time a new data value is written. This is a significant limitation. Each time the information in the OTP memory is needed by the software, the software must determine where the current information is located. Second, the user is not able to locate the information in OTP memory without first reading a potentially large portion of the OTP memory. The drawback to this approach is that a significant amount of time may be wasted in the execution of the software. Third, the virgin state of the OTP memory must be designated as an illegal value that cannot be used as data, otherwise it would be impossible to differentiate between the first byte of unused OTP memory and the last byte of valid data. These limitations and drawbacks apply not only to smart credit card applications, but also to other applications which use OTP memory.

SUMMARY OF THE INVENTION

The previously mentioned needs are fulfilled and other advantages achieved with the present invention. In one form, the present invention comprises a progressively programmable nonvolatile memory in a data processing system and a method of operation. The system comprises a communication bus, a nonvolatile memory coupled to the communication bus and divided into a one or more sections, and a control means for receiving information and storing information in nonvolatile form to control which section of the nonvolatile memory is coupled to the communication bus. Each of the one or more sections of the nonvolatile memory is capable of being programmed to store information, but only one section of the nonvolatile memory is functionally coupled to the communication bus at one point in time. Each of the one or more sections of the nonvolatile memory can be functionally coupled to the communication bus only once, and subsequently can be functionally decouped from the communication bus only once.

The present invention will be understood by one skilled in the art from the detailed description below in conjunction with the accompanying drawings.

BRIEF DESCRIPTION OF THE DRAWINGS

FIGS. 2A–2D illustrate, in block diagram form, four examples of how an array of nonvolatile memory can be partitioned into sections of various sizes that can be progressively programmed in accordance with the present invention;

DESCRIPTION OF THE PREFERRED EMBODIMENT

The preferred embodiment in the following description assumes a memory system organized as a byte-wide system. That is, each addressable location in a memory described herein contains one byte, or eight bits, of data. As is apparent, many memory systems are organized differently, using words (two bytes), long words (four bytes) or some other unit as the size of each addressable location. Therefore, all references in the following description to a number of bytes or the like should be interpreted as exemplary only and as including the possibility of variations in the number of bits stored at each addressable location. The symbol "$" preceding a number is used to indicate that the number is represented in its hexadecimal or base sixteen form.

Figure 1:
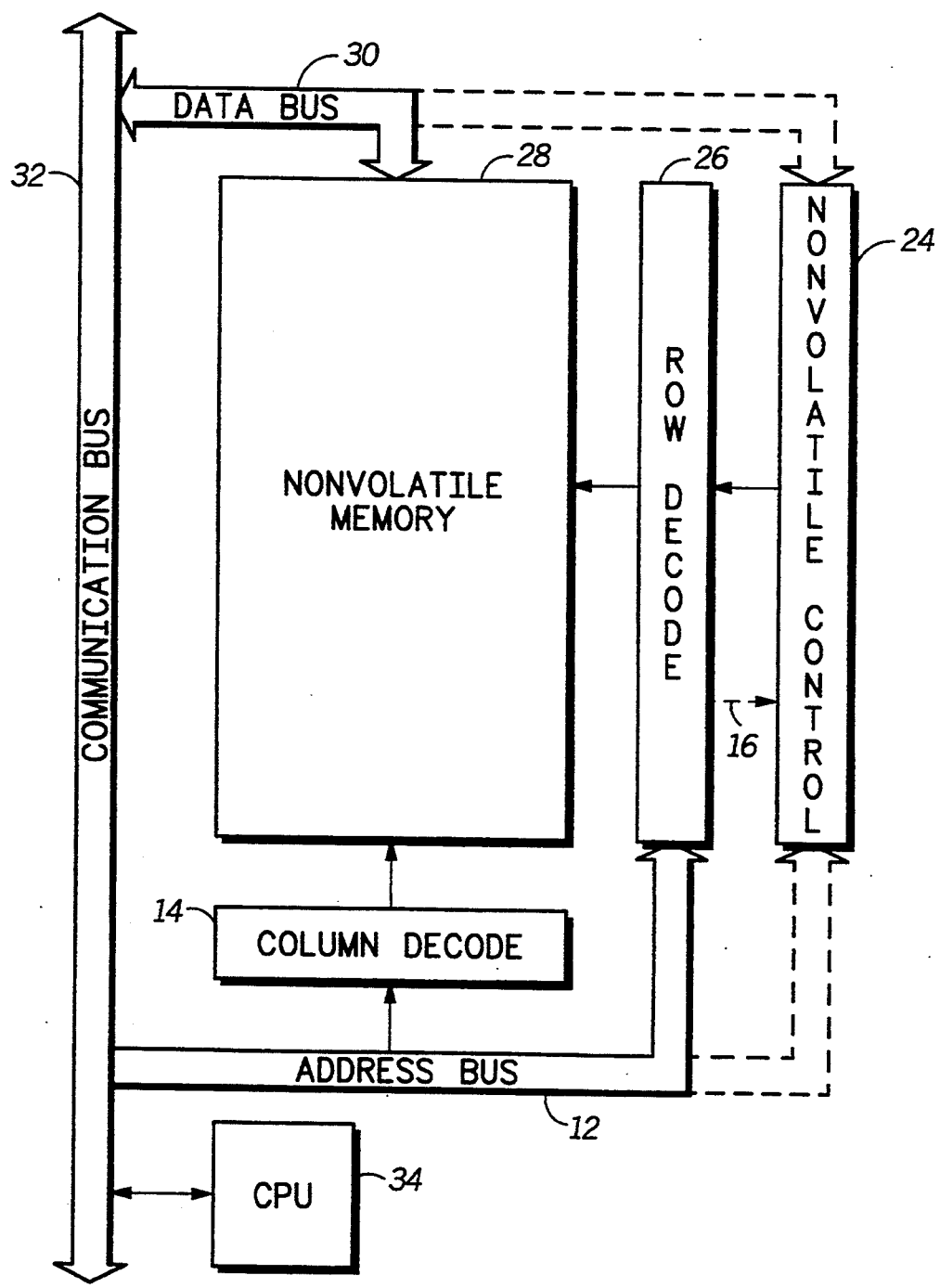
FIG. 1 illustrates, in block diagram form, a data processor having a progressively programmable nonvolatile memory in accordance with the present invention.

Referring to FIG. 1, the block diagram illustrates an example of a data processor 10 and a nonvolatile memory 28. Although the nonvolatile memory 28 in the preferred embodiment has eight bytes of OTP memory, the present invention would be applicable to other size memory arrays and to any other type of nonvolatile memory, such as, for example, ROM, E$^2$PROM, EPROM, PROMs, fused links, and any type of nonvolatile memory that can only be programmed once.

The data processor 10 has a central processing unit (CPU) 34 which is bidirectionally connected to a communication bus 32. The communication bus 32 is connected to an address bus 12 and bidirectionally connected to a data bus 30. The data bus 30 is also bidirectionally connected to the nonvolatile memory 28. The nonvolatile memory 28 receives inputs from a row decode 26 and a column decode 14. The address bus 12 is connected to the row decode 26 and the column decode 14. It should be understood that the address bus 12 and the data bus 30, in one form, could be combined to form one bus. For example, if one time multiplexed bus is used, the nonvolatile memory 28 uses the bus when a data cycle is being run and the column decode 14 and row decode 26 use the bus when an address cycle is being run.

In other forms of the present invention which are discussed in further detail below, the CPU 34 can communicate with the nonvolatile control 24 using the communication bus 32, the address bus 12 and the bidirectional data bus 30. These additional communication paths are represented by dotted lines in FIG. 1 coupling nonvolatile control 24 to both the data bus 30 and the address bus 12. In addition, these implementation variations may or may not require a data path 16 (represented by a dashed line in FIG. 1 to indicate the optionability) which connects row decode 26 and nonvolatile control 24.

Continuing with FIG. 1, the CPU 34 can communicate with the nonvolatile memory 28 using the communication bus 32, the address bus 12 and the bidirectional data bus 30. The CPU 34 uses the communication bus 32 and the address bus 12 to select which byte or bytes of nonvolatile memory 28 are to be accessed. The CPU 34 does this selection by sending the address of the byte or bytes to be accessed across the communication bus 32, across the address bus 12, and to both the column decode 14 and the row decode 26. The column decode 14 then determines which columns of nonvolatile memory 28 are to be selected.

In the present embodiment, the column decode merely selects all of the columns because the nonvolatile memory 28 is only one byte wide and all of the columns must be selected each time to select an entire byte. However, the column decode 14 may be more complex if the nonvolatile memory 28 is more than one byte wide because only certain columns must be selected when the nonvolatile memory 28 is accessed.

The row decode 26 is more complex than the column decode. The row decode 26 and the nonvolatile control 24 determine which section of nonvolatile memory 28 is accessed and which byte within that section is accessed. A mask option (not shown), which is selected by the user during manufacturing, is used to determine the number of sections into which the memory is to be functionally divided. This mask option is usually a simple change in a metal layer (not shown) during the fabrication of the data processor 10. This mask option can be part of the row decode 26 circuitry or can be located elsewhere on the chip and the information can be transmitted to the row decode 26 across the communication bus 32 and the address bus 12.

Although the present embodiment uses a mask option to determine the number of sections into which the memory is to be functionally divided, it would be possible to instead use nonvolatile memory to store a value which determines the number of sections into which the memory is to be functionally divided. This value could be programmed into any type of nonvolatile memory, including ROM, EPROM, one time programmable memory, or EEPROM.

The CPU 34 uses the communication bus 32 and the data bus 30 to write data to the nonvolatile memory 28, which is how the nonvolatile memory 28 is programmed. The CPU 34 also uses the communication bus 32 and the data bus 30 to read data from the nonvolatile memory 28, which is how the programmed information is retrieved.

Referring to FIGS. 2A–2D, four block diagrams illustrate four methods that nonvolatile memory 28 can be partitioned into sections. Option A of FIG. 2A partitions nonvolatile memory 28 into eight sections where each section contains one byte. Option A allows the user to effectively program the same one byte of nonvolatile data at address location $0 up to eight times. Although the user is actually programming different bytes in nonvolatile memory 28, it appears to the user that he is reprogramming the same byte of memory at location $0 in his software program. The nonvolatile control 24 keeps track of which byte contains the current information and which bytes have not yet been used. Option B partitions nonvolatile memory 28 into four sections where each section contains two bytes. Option B of FIG. 2B allows the user to effectively program two byte of nonvolatile data at address locations $0 and $1 up to four times. Option C of FIG. 2C partitions nonvolatile memory 28 into two sections where each section contains four bytes. Option C allows the user to effectively program four bytes of nonvolatile data at address locations $0–$3 twice. Option D of FIG. 2D leaves nonvolatile memory 28 as one entire block containing eight bytes. Option D only allows the user to program the memory once at address locations $0–$7. Option D is the typical way in which most existing nonvolatile memory arrays are accessed.

The user selects which option he wants by way of a mask option metal layer during manufacturing. Once one of Options A, B, C and D, or others not discussed, is chosen during the manufacturing process, the option cannot subsequently be changed. So any data processor 10 design using the present invention allows for multiple options, but only one option can be chosen for a particular chip during the manufacturing process. And once an option is chosen, the option becomes part of the circuitry of that particular chip. So a user who needs to reprogram one byte of data just a few times during the lifetime of his product can purchase data processor 10 chips that are all Option A which allows him to reprogram one byte up to eight times.

Figures 3, 4:
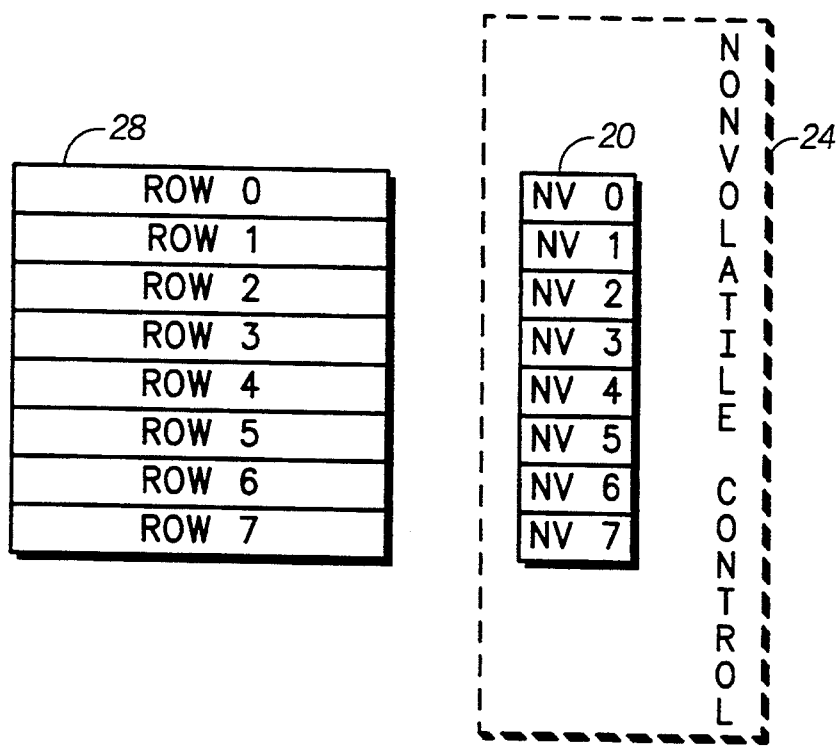
FIG. 3 illustrates in block diagram form an example of the nonvolatile memory and nonvolatile control of FIG. 1.
FIG. 4 is a table showing a correlation between the number of sections the memory of FIG. 1 may be partitioned into (Options A, B, C, and D), the row or rows that are to be programmed next (ROW0–ROW7), and corresponding nonvolatile control bits and their values (NV0–NV7), in accordance with the present invention.

Referring to FIG. 3, nonvolatile control 24 of FIG. 1 contains a number of nonvolatile control bits 20 which are labeled NV0–NV7. There is one nonvolatile control bit for each row of memory in nonvolatile memory 28. If these nonvolatile control bits 20 are bits that cannot be erased, for example EPROM bits contained within a plastic package, then they can only be programmed to their asserted state (i.e. non-virgin state) once. These nonvolatile control bits 20 can be any type of nonvolatile memory that can be programmed, either by the hardware or by the user, at least once during operation.

Whether the user can directly read and/or write the various nonvolatile control bits 20 depends upon how much of the implementation is done in software and how much is done in hardware. If the implementation is done primarily in hardware, the user will not need to be able to read or write the nonvolatile control bits 20, and thus address bus 12 and data bus 30 need not be connected to the nonvolatile control 24. Instead, hardware in row decode 26 will determine when a write has taken place and will then transfer information to nonvolatile control 24 across data path 16. This information from row decode 26 will be used by nonvolatile control 24 to determine when the next nonvolatile control bit 20 must be asserted. By reading back the same memory location immediately after writing it, the user is able to determine whether or not his attempt to reprogram the memory was successful. If the most recent write had no effect, the user knows that he can no longer reprogram the memory.

However, if the implementation is done primarily in software, the user will need to be able to write the nonvolatile control bits 20. Thus address bus 12 and data bus 30 must be connected to the nonvolatile control 24. Instead of hardware in row decode 26 determining when a write has taken place and when each nonvolatile control bit 20 must be asserted, the user must perform this task in software. The user must keep track of which section of nonvolatile memory 28 contains the current information and how many unused sections of nonvolatile memory 28 remain. If the user can read the nonvolatile control bits 20, as well as write them, this task is greatly simplified in software. A simple read of the nonvolatile control bits 20 provides the user with the necessary information. There is no need for data path 16 in this implementation, as row decode 26 will not need to transfer any information to nonvolatile control 24. Instead, the user will write and assert the proper nonvolatile control bit 20 when a new section of nonvolatile memory 28 is to be programmed and used.

And in yet a third possible implementation, the user can use a hybrid of hardware and software. The user will be able to read the nonvolatile control bits 20, and thus address bus 12 and data bus 30 must be coupled to the nonvolatile control 24. But the hardware, and not the user, will handle the assertion of the proper nonvolatile control bits 20. So as in the primarily hardware implementation, hardware in row decode 26 will determine when a write has taken place and will then transfer information to nonvolatile control 24 across data path 16. This information from row decode 26 will be used by nonvolatile control 24 to determine when the next nonvolatile control bit 20 must be asserted. The user can read the value of the nonvolatile control bits 20 in order to determine how many, if any, sections of unused nonvolatile memory 28 remain. This is the implementation described in the following discussion of the preferred embodiment.

Referring to FIG. 4, the table illustrates the relationship between the number of sections the nonvolatile memory 28 is partitioned into (Options A, B, C, and D), the row or rows that are to be programmed next (ROW0–ROW7), and the corresponding nonvolatile control bits 20 and their values (NV0–NV7).

Referring to FIG. 3 and FIG. 4, each time the user programs nonvolatile memory 28 by writing to the proper addresses, a corresponding single bit of the nonvolatile control bits 20 is asserted by the hardware circuitry. For example, if Option A is being used, the first write by the user to the nonvolatile memory 28 at address location $0 will cause a byte of data to be written into ROW 0 and will cause the nonvolatile control bit NV0 to be asserted. The nonvolatile control 24 and the row decode 26 will use the fact that NV0 is asserted to determine that ROW 0 is the proper row of nonvolatile memory 28 to access for a read and that ROW 1 is the proper row of nonvolatile memory 28 to access for a write. So any subsequent read to the nonvolatile memory 28 at address location $0 will access ROW 0, and any subsequent write to the nonvolatile memory 28 at address location $0 will access ROW 1.

The second write by the user to address location $0 will cause a byte of data to be written into ROW 1 and will cause the nonvolatile control bit NV1 to be asserted. The nonvolatile control 24 and the row decode 26 will use the fact that NV0 and NV1 are asserted to determine that ROW 1 is the proper row of nonvolatile memory 28 to access for a read, and that ROW 2 is the proper row of nonvolatile memory 28 to access for a write. Any subsequent read to the nonvolatile memory 28 at address location $0 will access ROW 1, and any subsequent write to the nonvolatile memory 28 at address location $0 will access ROW 2.

The above described process continues until the eighth write by the user to address location $0 causes a byte of data to be written into ROW 7 and causes the nonvolatile control bit NV7 to be asserted. Subsequent reads to the nonvolatile memory 28 at address location $0 will access ROW 7, but subsequent writes will have no effect.

It is often advantageous for the user to know ahead of time when he has run out of memory space to reprogram. So if the user can read the NV7 bit, he can use the NV7 bit as a status flag to indicate whether he can continue to reprogram memory location $0. Once NV7 is asserted, the user knows that he can no longer reprogram the nonvolatile memory 28. In addition, if the user is also able to read the values stored in the other nonvolatile control bits 20 (NV0–NV6), the user will be able to determine the number of times the user has remaining to reprogram the nonvolatile memory 28.

In the present embodiment, the user must program all of the bytes within a section of nonvolatile memory 28 during one programming sequence. This is because the last step of the programming sequence is the assertion of the corresponding nonvolatile control bit 20. During the programming sequence, that is before the corresponding nonvolatile control bit 20 is asserted, the user must program all of the bytes he intends to use. For example, if Option B is being used and the user has two bytes of information to store, the user must write and update the data in both address location $0 and address location $1 before the corresponding nonvolatile control bit 20 is asserted. If more complex decoding was used that kept track of which bytes within a block had been written, it would be possible for the user to continue using data from a prior section of memory until he had actually written new data for that byte into the next section of memory. However, in the trade-off between flexibility and complexity, the present embodiment chose less complexity and thus requires that the entire section of data be updated at the same time.

While most applications appear to require a nonvolatile memory 28 that can be programmed during the operation of the system, some applications may use a memory that is programmed at a prior time, such as, for example, during manufacturing. An example of such an application is a ROM that is programmed with a set of security codes during manufacturing. Although all of the security codes were programmed during manufacturing, the user can use the present invention to change which code he is accessing and using. Although the user has done all of the programming of the nonvolatile memory 28 prior to operation of the system, by progressively accessing different sections of the memory at the same software address, it effectively appears to the user as if he is progressively programming the memory. Even though a write to a ROM will have no effect on the ROM itself, the write operation can be used to assert the proper nonvolatile control bit 20 thus allowing the user to access the next nonvolatile memory 28 section.

By now it should be apparent that there has been provided a mechanism and technique to allow a nonvolatile memory to be divided into sections so that a user appears to be able to reprogram the same memory locations multiple times, when in fact the user is progressively programming and/or accessing different sections of the nonvolatile memory. The present invention provides a method and apparatus for progressively programming nonvolatile memory. The progressive programming of nonvolatile memory as taught herein has many uses, such as, for example, allowing EPROM packaged in a plastic package along with a microcontroller to appear to the user to be reprogrammable a selected number of times.

The present invention is particularly useful for microcontroller applications that require nonvolatile memory that is cheap and can be effectively reprogrammed a limited number of times. The disclosed method and apparatus allows product manufacturers who are using microcontrollers in their products to use cheap plastic packages rather than much more expensive ceramic packages for applications that require nonvolatile memory that can be updated several times during the lifetime of the product. The present invention is particularly useful for many large scale integrated electronic circuit applications, such as automobile control systems, smart credit cards, large appliances, and virtually any other product that requires some modification or adjustment over time.

Also, the present invention can be used to implement memory redundancy. For example, if a nonvolatile memory has one or more bit failures, the memory can be partitioned into sections and those memory sections containing bit failures will not be used. The nonvolatile control bits 20 can be used to keep track of which memory sections are available and which are not because either that section has been previously used or because that section contains bit failures.

While the present invention has been shown and described with reference to specific embodiments, further modifications and improvements will occur to those skilled in the art. For example, the data processor 10 may or may not be contained on a semiconductor chip. The various buses can be of different sizes and types, such as serial or parallel. The nonvolatile memory 28 can be any type of nonvolatile memory or can be of any size in either dimension. It is to be understood, therefore, that this invention is not limited to the particular forms shown and that it is intended in the appended claims to cover all modifications that do not depart from the spirit and scope of this invention.

We claim:

1. A nonvolatile memory, comprising:
an address bus;
a data bus;
a plurality of storage circuits having a first memory address, said plurality of storage circuits being coupled to said data bus;
decode circuitry, coupled to said address bus and coupled to said plurality of storage circuits;
a first control circuit for storing a first control value, the first control circuit corresponding to a first one of said plurality of storage circuits;
a second control circuit for storing a second control value, the second control circuit corresponding to a second one of said plurality of storage circuits;
circuit means for receiving the first memory address during a memory access and for selecting the first one of said plurality of storage circuits if the first control value is a first value, if the second control value is a second value, and if the memory access is a read access, and said circuit means for selecting the second one of said plurality of storage circuits during the memory access if the first control value is the first value, if the second control value is the second value, and if the memory access is a write access, said circuit means being coupled to said address bus, to said plurality of storage circuits, to said decode circuitry, to said first control circuit, and to said second control circuit.

2. A nonvolatile memory according to claim 1, wherein said first and second control circuits can transition from the second value to the first value only once.

3. A nonvolatile memory according to claim 1, wherein said first and second control circuits are coupled to said data bus and are read and write accessible.

4. A nonvolatile memory according to claim 1, wherein the nonvolatile memory is a One Time Programmable (OTP) memory.

5. A nonvolatile memory according to claim 1, wherein the nonvolatile memory is an Erasable Programmable Read Only Memory (EPROM).

6. A nonvolatile memory according to claim 1, wherein the nonvolatile memory is coupled to a central processing unit by way of a communication bus.

7. A nonvolatile memory according to claim 1, wherein said plurality of storage circuits having a first memory address includes all memory cells in the nonvolatile memory.

8. A method for programming a nonvolatile memory in a data processing system, the data processing system having a communication bus coupled to the nonvolatile memory and having a central processing unit coupled to the communication bus, the nonvolatile memory having a first storage circuit and a second storage circuit coupled to the communication bus, the method comprising the steps of:
performing a first write access to a first memory address in the nonvolatile memory, comprising the steps of:
transferring said first memory address from the communication bus to the nonvolatile memory;
selecting, based upon a plurality of control bits, the first storage circuit;
transferring a first data value from the communication bus to the first storage circuit;
storing the first data value in the first storage circuit and not in the second storage circuit; and
asserting a first one of the plurality of control bits;
performing a first read access from said first memory address in the nonvolatile memory, comprising the steps of:
transferring said first memory address from the communication bus to the nonvolatile memory;
selecting, based upon the plurality of control bits, the first storage circuit;
transferring the first data value from the first storage circuit to the communication bus; and
performing a second write access to said first memory address in the nonvolatile memory, comprising the steps of:
transferring said first memory address from the communication bus to the nonvolatile memory;
selecting, based upon the plurality of control bits, the second storage circuit;
transferring a second data value from the communication bus to the second storage circuit;
storing the second data value in the second storage circuit and not in the first storage circuit; and
asserting a second one of the plurality of control bits.

9. The method according to claim 8, further comprising the step of:
repeating said step of performing a first read access from said first memory address before executing said step of performing a second write access.

10. The method according to claim 8, wherein once the first and second ones of the plurality of control bits are asserted, the first and second ones of the plurality of control bits cannot be negated.

11. The method according to claim 8, wherein the first and second storage circuits cannot be erased.

12. The method according to claim 8, further comprising the step of:
transferring said first memory address from the central processing unit to the communication bus.

13. The method according to claim 8, further comprising the step of:
after executing said step of performing a second write access, performing a second read access from said first memory address in the nonvolatile memory, comprising the steps of:
transferring said first memory address from the communication bus to the nonvolatile memory;
selecting, based upon the plurality of control bits, the second storage circuit; and
transferring the second data value from the second storage circuit to the communication bus.

14. A nonvolatile memory, comprising:
an address bus;
a data bus;
a first storage circuit being accessed via a first memory address, said first storage circuit being coupled to said data bus;
a second storage circuit being accessed via the first memory address, said second storage circuit being coupled to said data bus; and
circuit means for receiving the first memory address during a memory access and for selecting said first storage circuit if the memory access is a read access, and for selecting said second storage circuit if the memory access is a write access, said circuit means being coupled to said address bus and to said first and second storage circuits.

15. A nonvolatile memory according to claim 14, wherein said circuit means comprises:
a first status circuit corresponding to said first storage circuit, said first status circuit storing a first status value before a first data value is written into said first storage circuit, said first status circuit storing a second status value after the first data value is written into said first storage circuit;
a second status circuit corresponding to said second storage circuit, said second status circuit storing a first status value before a second data value is written into said second storage circuit, said second status circuit storing a second status value after the second data value is written into said second storage circuit; and
decode circuitry for decoding at least a portion of the first memory address, said decode circuitry being coupled to said first and second status circuits.

16. A nonvolatile memory, according to claim 15, wherein said first and second status circuits are coupled to said communication bus and can be read and written by said central processing unit.

17. A nonvolatile memory according to claim 15, wherein said first and second status circuits can transition from the second value to the first value only once.

18. A nonvolatile memory according to claim 15, further comprising:

a third storage circuit being accessed via a second memory address, said third storage circuit being coupled to said data bus; and a fourth storage circuit being accessed via the second memory address, said fourth storage circuit being coupled to said data bus; and wherein said circuit means further comprises:

a third status circuit corresponding to said third storage circuit; and a fourth status circuit corresponding to said fourth storage circuit.

19. A nonvolatile memory according to claim 14, wherein the nonvolatile memory is a One Time Programmable (OTP) memory.

20. An integrated circuit, comprising:

a central processing unit;

a communication bus, coupled to said central processing unit; and a nonvolatile memory, coupled to said communication bus;

wherein said nonvolatile memory comprises:

a first storage circuit being accessed via a first memory address, said first storage circuit being coupled to said communication bus;

a second storage circuit being accessed via the first memory address, said second storage circuit being coupled to said communication bus; and circuit means for receiving the first memory address during a memory access and for selecting said first storage circuit if the memory access is a read access, and for selecting said second storage circuit if the memory access is a write access, said circuit means being coupled to said first and second storage circuits.

21. A nonvolatile memory according to claim 20, wherein said circuit means comprises:

a first status circuit corresponding to said first storage circuit, said first status circuit storing a first status value before a first data value is written into said first storage circuit, said first status circuit storing a second status value after the first data value is written into said first storage circuit;

a second status circuit corresponding to said second storage circuit, said second status circuit storing a first status value before a second data value is written into said second storage circuit, said second status circuit storing a second status value after the second data value is written into said second storage circuit; and decode circuitry for decoding at least a portion of the first memory address, said decode circuitry being coupled to said first and second status circuits.

* * * * *